United States Patent
Boisrayon et al.

(10) Patent No.: US 6,335,856 B1
(45) Date of Patent: Jan. 1, 2002

(54) TRIBOELECTRIC DEVICE

(75) Inventors: Michel P. Boisrayon, Le Beausset; Alain A. Scarpitta, Toulon; Luc P. Meyer, La Farlede, all of (FR)

(73) Assignee: L'Etat Francais, represente par le Delegue Ministeriel pour l'Armement, Paris (FR)

( * ) Notice: Subject to any disclaimer, the term of this patent is extended or adjusted under 35 U.S.C. 154(b) by 0 days.

(21) Appl. No.: 09/285,692

(22) Filed: Apr. 5, 1999

(30) Foreign Application Priority Data

Mar. 5, 1999 (FR) .............................. 99 03044

(51) Int. Cl.$^7$ .............................................. H04R 17/00
(52) U.S. Cl. ...................................... 361/230; 310/311
(58) Field of Search .......................... 307/400; 29/886; 310/337, 363, 345, 311, 320–322; 136/254; 361/230

(56) References Cited

U.S. PATENT DOCUMENTS

| | | |
|---|---|---|
| 2,420,864 A | 5/1947 | Chilowsky |
| 2,521,329 A | 9/1950 | Begun |
| 2,540,187 A | 2/1951 | Cherry, Jr. |
| 2,607,858 A | 8/1952 | Mason |
| 2,787,784 A * | 4/1957 | Meryman et al. ............ 340/596 |
| 2,928,068 A | 3/1960 | Samsel et al. |
| 3,032,706 A | 5/1962 | Wieder |
| 3,071,841 A | 1/1963 | Brussaard et al. |
| 3,167,668 A * | 1/1965 | Nesh .......................... 310/9.7 |
| 3,192,420 A | 6/1965 | Cowan |
| 3,404,296 A | 10/1968 | Jaffe et al. |
| 3,474,268 A | 10/1969 | Rudnick |
| 3,868,553 A | 2/1975 | Adler |
| 3,942,029 A * | 3/1976 | Kawakami ..................... 307/88 |
| 4,233,485 A | 11/1980 | Sato et al. |
| 4,345,359 A | 8/1982 | Micheron |
| 4,356,424 A | 10/1982 | Marcusz |

(List continued on next page.)

FOREIGN PATENT DOCUMENTS

| | | |
|---|---|---|
| EP | A-0 147 112 | 7/1985 |
| EP | A-0 247 734 | 12/1987 |
| EP | A-0 388 027 | 9/1990 |
| GB | 2 059 716 | 2/1977 |
| JP | 0 018 147 | 2/1977 |

OTHER PUBLICATIONS

Proceedings of the First International Symposium on Piezoelectricity in Biomaterials and Biomedical Devices, PISA, Italy, Jun. 20–22, 1983 vol. 60, No. 1–4, ISSN 0015–0193, Feeroelectrics, Oct. 1984, UK pp. 285–296, Fukada E 'Piezoelectricity of Natural Biomaterials', p. 294—p. 296.

Phase Transitions, 1989, UK, vol. 818, No. 3–4, ISSN 0141–1594, pp. 135–141, Fukada E 'Introduction: early studies in piezoelectricity, pyroelectricity, and ferroelectricity in polymers'. (No month available).

*Primary Examiner*—Ronald W. Leja
(74) *Attorney, Agent, or Firm*—Oliff & Berridge, PLC

(57) ABSTRACT

A triboelectric device includes a voltage source, a polarizing amplifier, and electrodes to apply a polarizing voltage to a first material of the device. The electrodes are not fixed to the first material, allowing relative rubbing displacement between the electrodes and the first material. Preferably, a conductive second material, such as petrolatum, is provided between the first material and the electrodes. Such a device can have its properties change while in service. To accommodate this, the voltage source preferably provides an adjustable polarization voltage. The triboelectric device is useful as a transducer, and particularly useful as a hydrophone used in sonar antenna, as its mode type can be changed in the field during service to correct spurious signals or interferring noises.

22 Claims, 4 Drawing Sheets

U.S. PATENT DOCUMENTS

| | | |
|---|---|---|
| 4,407,054 A | 10/1983 | Zipfel, Jr. |
| 4,443,730 A | 4/1984 | Kitamura et al. |
| 4,443,733 A | 4/1984 | Samodovitz |
| 4,533,849 A | 8/1985 | Schnell |
| 4,538,087 A | 8/1985 | Germano et al. |
| 4,638,206 A * | 1/1987 | Tsunooka .................. 310/313 |
| 4,647,881 A | 3/1987 | Mitsutsuka |
| 4,684,337 A | 8/1987 | Bauer |
| 4,705,003 A | 11/1987 | Sakakibara et al. |
| 4,714,848 A | 12/1987 | Chen |
| 4,841,494 A | 6/1989 | Banno |
| 4,868,856 A | 9/1989 | Frith et al. |
| 4,877,988 A * | 10/1989 | McGinniss .................. 310/306 |
| 4,916,349 A | 4/1990 | Kornrumpf |
| RE33,691 E | 9/1991 | Harnden, Jr. et al. |
| 5,166,907 A | 11/1992 | Newnham et al. |
| 5,210,455 A | 5/1993 | Takeuchi et al. |
| 5,229,979 A | 7/1993 | Scheinbeim et al. |
| 5,246,610 A * | 9/1993 | Banno ...................... 252/62.9 |
| 5,327,895 A | 7/1994 | Hashimoto et al. |
| 5,350,964 A | 9/1994 | Hara et al. |
| 5,585,546 A * | 12/1996 | Gururaja ......................... 73/1 |

\* cited by examiner

TRIBOELECTRIC DEVICE

BACKGROUND OF THE INVENTION

The invention relates to the field of triboelectricity, specfically a triboelectric device with variable and adjustable polarization.

Triboelectic devices can be used, for example, in the electromechanical transducers used in sonar antennas. These transducers may be hydrophones; accelerometers; detectors of hydrostatic pressure, deformation, force or temperature; or complex systems combining these different functions. These devices may also be used in the air in microphones, accelerometers, telex or computer keyboards, heat detectors, or coatings that change colors under applied pressure.

Most transducers used in industry are piezoelectric material and particularly composite piezoelectric material.

U.S. Pat. No. 2,420,864 describes a process for producing a piezoelectric material comprising a plastic matrix and a single plezoelectic crystal.

The plastics quoted are celluloids, cellulose acetates, chlorinated rubbers, phenol-formaldehydes, phenol-furfurol resins, acrylates, methacrylates and polystrenes, while the single crystals are chosen amongst Rochelle salt, tourmaline, saccharose and tartaric acid.

These materials are intended for use only in hydrostatic mode, in other words with their entire surface exposed to the incident sound pressure. However, these single crystals have very low hydrostatic constants and are therefore not very effective.

Single crystals have progressively been replaced by perovskite ceramics and more particularly by lead zircon titanate (PZT) or barium titanate, so that high emission powers can be used. For reception purposes however, their hydrostatic constant is less than that of single crystals, such as lithium sulphate, and their use is therefore limited to particular compression modes belonging to types 33, 31 or 32.

U.S. Pat. No. 4,233,485 describes a composite piezoelectric material consisting of ceramic powder and polymer. This powder is a sintered mixture of lead titanate and double iron/bismuth oxide with a mean grain size of 5 microns, while the weight contribution of the double iron/bismuth oxide ranges from 50 to 80%.

U.S. Pat. No. 4,407,054 describes a composite piezolectric material consisting of a prepolymer, such as a mixture of castor oil and ricinoleate isocyanate, and a piezoelectric material such as quartz, PZT, tourmaline, tartaric acid or lithium sulphate Finally, U.S. Pat. No. 4,868,856 describes a composite piezoelectric material consisting of a polymer produced from polyurethane and a piezoelectric material such as tartaric acid, a monosaccharide, a disaccharide, or a carboxylate.

It is also known that the products known as "Electrets", obtained by subjecting waxes liquefied by heating to a strong electrical field during their cooling phase, exhibit pronounced and permanent pyroelectric and piezoelectrc properties.

All these materials have a number of disadvantages, notably when they are used in hydrophones. In fact their polarization and, more generally, their piezoelectric properties, are fixed during manufacture and they consequently have a single or specialized mode of operation (hydrostatic mode, mode 33, 31, 15, and so on). For example a composite produced by mixing grains of tartaric acid or lithium sulphate with an unpolymerized resin, the grains then being polarized using one of the processes described in the earlier patents, can be used only in hydrostatic mode, and its piezoelectric properties are, in principle, invariable or vary slowly with time.

SUMMARY OF THE INVENTION

One of the purposes of the present invention is to obtain a material whose properties can be varied as required by applying an electric field when the transducer including this material, or the antenna comprising the transducers using this composite material, is in service. Thus, for example, when an antenna becomes faulty, it is possible to use a material according to the invention in the antenna to correct the fault. It is therefore unnecessary to take action involving the receiver, which is not always possible, or which increases the cost of the receiver.

The antennas may also be exposed to interfering noise or to continuous or transient spurious signals. The invention makes it possible to eliminate or reduce these interfering noises and spurious signals by directly modifying the characteristics of the elementary sensors.

For this purpose, the french patent FR9404853 describes a piezoelectric device including means for applying a polarizing voltage to a material, said means comprising a voltage source, a polarizing amplifier and electrodes fixes to the material, and preferably, means of adjusting the value of the polarizing voltage.

Many steps are necessary to manufacture such a device.

It is a main object of the invention to provide a transducer having the same functionality as the one described in the french patent FR9804853 but with an increased sensitivity and far simpler to manufacture.

The Present invention relates to a triboelectric device comprising means for applying a polarizing voltage to a first material, said means comprising a voltage source, a polarizing amplifier and electrodes wherein the first material is a polymer or dielectric organic substance, which is piezoelectic not piezoelectric or slightly piezoelectric, and the electrodes are not fixed to the first material, allowing relative rubbing displacements between the electrodes and the first material.

According to a particular embodiment a conductive material, called a second material in the following, is interposed between the electrodes and the first material.

According to an additional embodiment, the second material is petrolatum.

According to a particular embodiment the polymer or the dielectric organic substance is chosen from the polystyrenes, polysulfones, polycarbonates, or polypropylene, polyethylene, the polyethylene terephthalates, polyphenylene oxides, polyacrylate esters, polymethacrylate esters, polyvinyl chlorides, polyvinyllidenes, acrylonitrile polymers, methacrylonitrile polymers, polyvinyl acetates, celluloids, cellulose acetates, polyvinyl pyrrolidones, cellulosic polymers, phenol formaldehydes, phenol-furfural resins, soluble polymers of polyimide, epoxy resins, polymerisable resins, natural rubbers, synthetic rubbers, silicone resins, methanol or bone glues, polystyrols, gum-lacs, copolymers of vinylidene and trifluoroethylene.

According to a particular embodiments, said means for applying a polarizing voltage to a first material comprises means of adjusting the value of the polarizing voltage.

Furthermore the polarizing voltage may be continous or alternating.

According to a particular embodiment, these electrodes are of the comb type.

According to an another embodiment, the first material comprises particles such as fibers, powders or fragments of objects or materials which are, according to circumstances, piezoelectric, slightly piezoelectric or even non-piezoelectric.

According to another embodiments, the size of the particles is between $5 \times 10^{-9}$ m and $5 \times 10^{-3}$ m.

According to a particular embodiments, particles are wholly or partly chosen from a biological material or from sheets or wafers of piezoelectric plastics materials that are either prepolarized in the through-thickness direction or not prepolarized, or from microcrystals.

According to a preferential embodiment, the biological material is chosen the oligosaccharides, the homopolysaccharides, the heteropolysaccharides, the glycosaminoglycans, the proteoglycans, terpenes, steroids, amino acids, oligopeptides and polypeptides, proteins, nucleotides or nucleic acids, urea or natural silk.

According to another embodiment, particles are, wholly or partly, microcrystals or fibers of ammonium tartrate. potassium tartrate, ethylene diamine tartrate, dipotassium tartrate, sodium chlorate, sodium bromate, nickel sulphate hexahydrate, iodic acid, benzophenone, hydrated or dehydrated lithium gallate, polyvinyl difluoridine, polyvinyl chloride, copolymer of vinyl acetate and vinylidene cyanide, copolymer of vinylidene and trifluoroethylene, polyvinyl fluoride, nylon, polyacrylonitrile, polyparaxylene, polybichloromethyloxetane, aromatic polyamide, polysulfone, cyanoethylcellulose, monosaccharides, disaccharides, brushite, monetite or salts of carboxylic acid.

In this way it is possible to obtain a bimodal or polymodal material, i.e., a material which, depending on the nature of its piezoelectric components, may be for example used either in mode 33, or in hydrostatic mode, the mode of operation depending upon the field applied to it.

By using at least two devices according to the invention, one can obtain a sensor operating in two different modes.

BRIEF DESCRIPTION OF THE DRAWINGS

Other advantages and characteristic of the present invention will appear from the description of embodiments applied mainly to hydrophones, having regard to the attached figures wherein:

FIG. 1 is a first embodiment of a device according to the invention. The device comprises a first material 1 made of silicone resin, a second material consisting of a petrolatum layer 2 and means 9 for applying a polarizing voltage to these two materials. Means 9 comprises two electrodes 12,13 electrically connected to a polarizing amplifier 11, which is connected to a voltage source 10.

FIGS. 2a and 2b show means 9 for applying a polarizing voltage U to the tubes 6 and discs 7 made from a matrix of polymer with particles of Monetite, a mineral having the formula $CaHPO_4$. A film of VASELINE™ (white petrolatum) is interposed between the electrodes 12, 13 and the matrix of polymer.

Each of these means 9 comprises a voltage source 10 to generate a potential difference U between electrodes 12, 13. V is a low voltage signal emitted by the material of the matrix rubbing on the electrodes during operation, and $\alpha$ is the amplification factor of the differential amplifier 14. The output of differential amplifier 14 is accordingly $\alpha V$.

Figure 1:
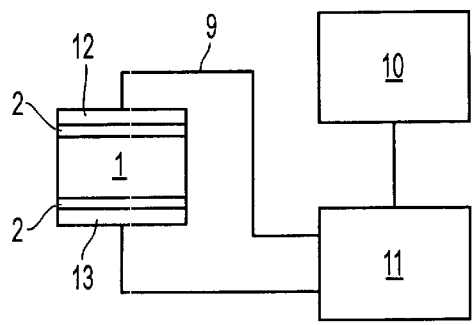
FIG. 1 show a first embodiment of a device according to the invention.
Figure 2A:
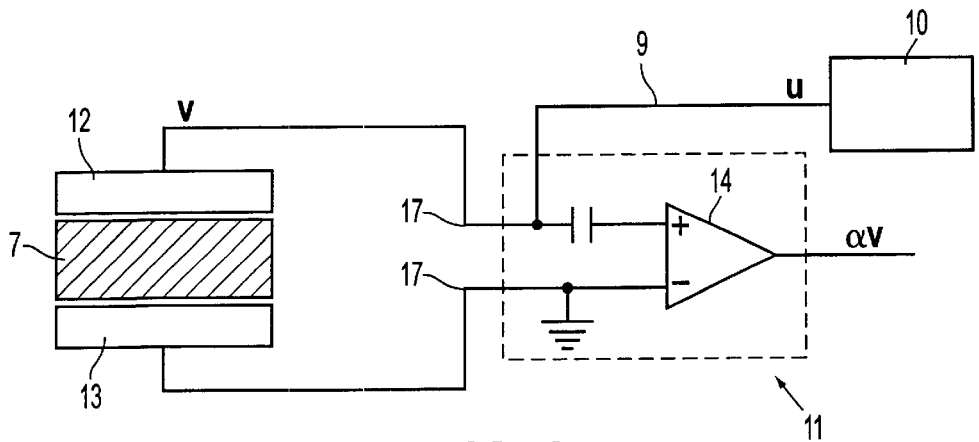
FIGS. 2a to 2d show means of applying a polarizing voltage U according to a second embodiment of the invention.
Figure 2B:
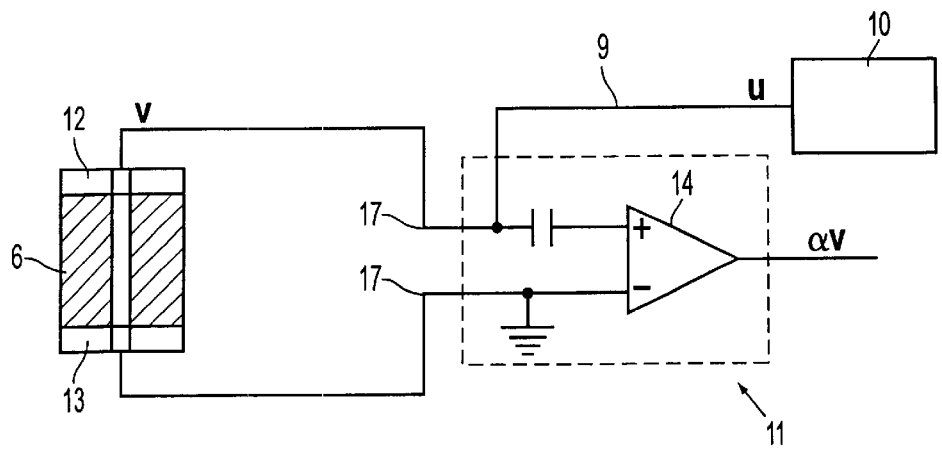
Figure 2C:
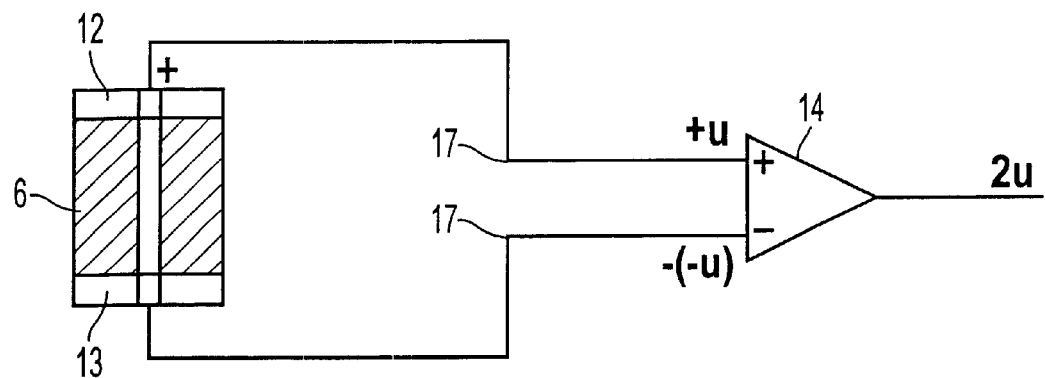
Figure 2D:
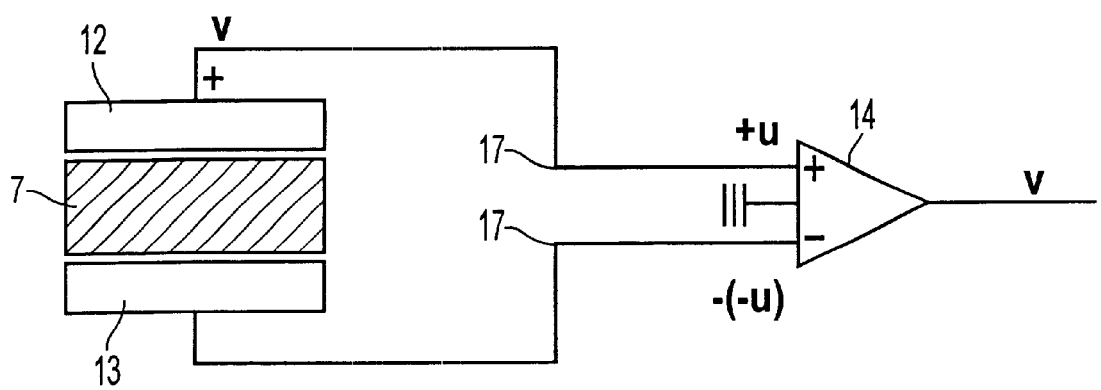

The utility of this type of arrangement is as follows: the tubes 6 are arranged and connected to a differential preamplifier 14 as shown in FIG. 2c, which enables their hydrophonic sensitivity to be used to the fullest. On the other hand, since the discs 7 are arranged and connected to a differential preamplifier 14 as shown in FIG. 2d, they operate as accelerometers. This is therefore an example of a sensor with two functions. FIGS. 2c and 2d show polarizing voltages (u), (−u) applied to the differential preamplifiers 14 resulting in outputs v (FIG. 2d) and 2u (FIG. 2c).

The variable polarization applied to the sensitive elements creates a third function which is that of correcting the asymmetry of the sensitive elements (due to differences in sensitivity to sound pressure) as previously mentioned and the compression of defects that might appear in these materials over time. In this way a veritable adaptive function can be obtained.

Here again, the polarization can be modified as required in order to correct any faults of symmetry in the sensitive elements in order to better compensate for spurious accelerations.

The material is inserted between two petrolatum layers which are inserted between metal electrodes 12, 13 having the shape required for the applications in view. These electrodes 12, 13 are fitted with two connecting leads 17 which simultaneously collect the signal provided by the sensor when it is excited by a suitable phenomenon (sound pressure for a hydrophone, acceleration for an accelerometer, etc.), and supply the polarizing voltage from the source 10 necessary for the sensor to operate. It will be noted that signal 16 is taken at the output of a polarising amplifier 11, which separates the DC polarising voltage, which can vary from a few volts to 3 kV, from the low voltage signal supplied by the sensor.

As an example, in order to produce a device according to the invention, a silicone resin matrix supplied by the RHODORSYL company is used.

The silicone resin is in the form of a resin A and a hardener B. Forty grams of resin and four grams of hardener are mixed in a mixer and 2.2 grams of brushite microcrystals are gradually incorporated in the mixture of prepolymer until there is complete homogenization. The mixture is then degassed using a vacuum pump.

Figure 3:
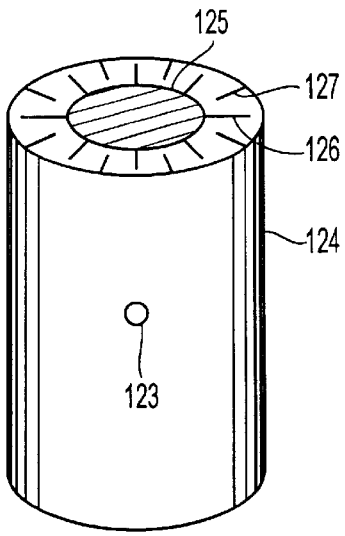
FIG. 3 is a diagram of a mold used for manufacturing a triboelectric material according to the invention.

With the resin still in the state of a prepolymer the mixture is injected through an orifice 123 into a mold made of a plastic material and comprising two tubular part 124, 125 with different diameters and having, as shown in FIG. 3, the positive mark of the electrodes. The electrodes are made of aluminium bronze and are of the comb type. For the biggest diameter part 124, marks 127 are distributed on the inner surface while for the smallest diameter part 125, the marks 126 are on the external surface. The dimensions of those marks 126, 127 are slightly greater then those of the corresponding electrodes such that when the electrodes are placed on the molded material, there is a positive allowance of about $10^{-4}$ m.

Figure 4:
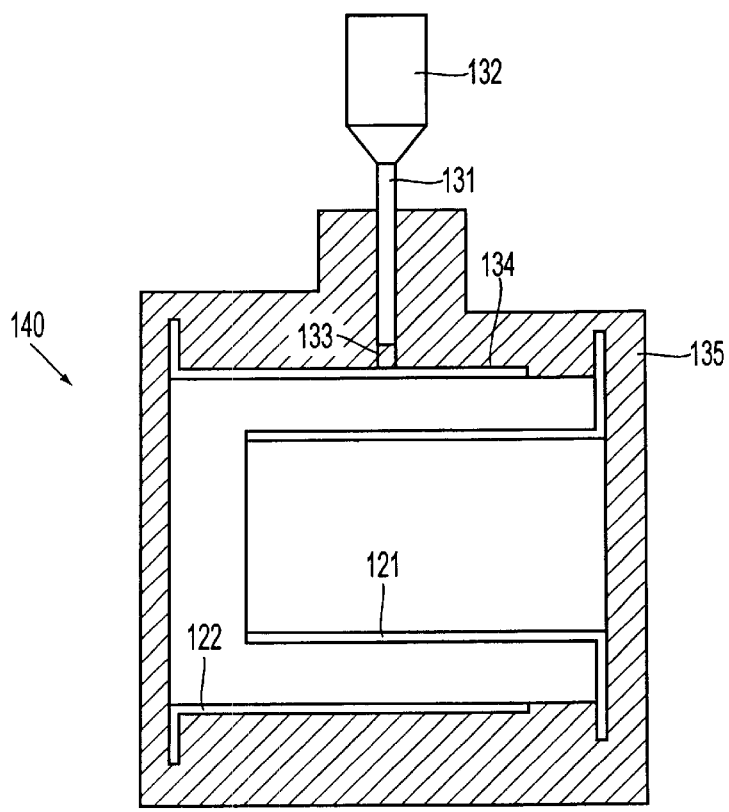
FIG. 4 is a diagram of the electrical connections to the electrodes.

The mixture of resin and microcrystals is left to polymerize for 48 hours. The material is then plunged into petrolatum and then placed between the electrodes. A film of petrolatum then appears between the silicone resin and the electrodes. A coaxial cable 131 fitted with a plug 132 at its free end is connected to the electrodes 121 and 122 as shown in FIG. 4. The screening 133 of the cable 131 is connected to the outer electrode 122. The central conductor 134 of the cable 131 is connected to the inner electrode 121. The whole assembly is placed in another mold to be given an outer coating 135 of polyurethane resin. During this operation, part of the cable 131 is embedded in the coating 135. This process produces a sensor which is used as a hydrophone 140.

Figure 5:
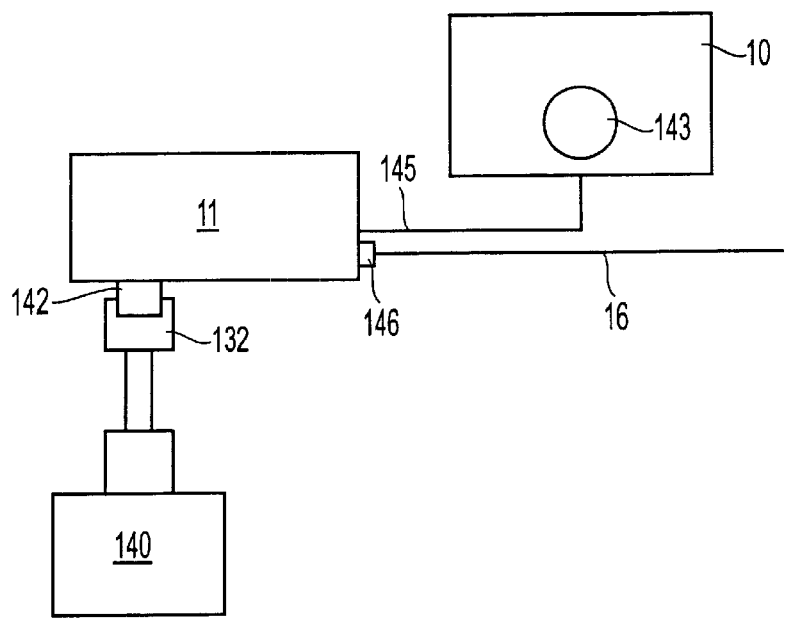
FIG. 5 is a general diagram of the component parts of the invention.

As shown on FIG. 5, the plug 132 is connected to a polarizing amplifier 11, shown in the form of a box, which is provided with a coaxial socket 142 which can simultaneously collect the signal supplied by the hydrophone and supply a DC polarizing voltage.

This voltage can be adjusted by a potentiometer 143, from 0 V to 2 kV according to the required sensitvity.

The polarizing amplifier 11 is connected to a DC voltage source 10 by means of a cable 145. The cable 145 is connected directly to the inside of the box and the latter is fitted with a socket 146 which collects the low voltage signal 16 supplied by the hydrophone 140 and amplified in this unit.

Figure 6:
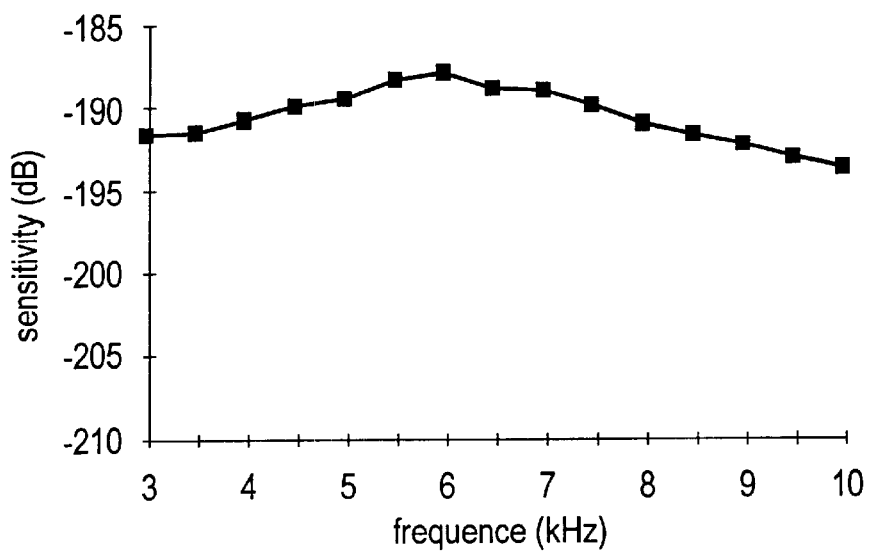
FIG. 6 shows the variation in the sensitivity of a hydrophone according to changes in the frequency and polarizing voltage.

The sensitivity of this hydrophone has been evaluated in an acoustic tank. Measurements were made using a sound signal over a frequency range from 2.5 kHz to 10 kHz. In the absence of a polarizing voltage, the hydrophone has no measurable sensitivity. A measurable sensitivity is obtained once the polarizing voltage reaches 100 V, with optimal sensitivity being obtained for a polarizing voltage of 500 V. FIG. 6 shows the sensitivity curves obtained at 440 V in the above-mentioned frequency band. Sensitivity is expressed in decibels, the reference being 1 V/$\mu$Pa, and is of about −195 dB. This sensitivity is better than the one obtained with a piezoelectric material.

A device according to the invention can be operated as describes hereinafter.

A potential difference, for example 500V, is applied to the electrodes 12, 13 placed around the material 1 and 2 as described in the first embodiment. The hydrophone is placed in water and waves are generated. The material 1 then vibrates relative to the electrodes, thus generating rubbing between them. Rubbing generates charges as electrons which move according to the potential difference between the electrodes and rubbing variations generate a low potential signal V that is amplified by the polarizing amplifier and then transmitted to processing means capable of identifying the waves.

What is claimed is:

1. A triboelectric device comprising means for applying a polarizing voltage to a first material which is a polymer or dielectric organic substance, said means comprising a voltage source, a polarizing amplifier and electrodes which are not fixed to the first material, allowing relative rubbing displacement between the electrodes and the first material, wherein the electrodes are of the comb type.

2. The triboelectric device according the claim 1, wherein the polymer or the dielectric organic substance is chosen from the following group including polystyrenes, polysulfones, polycarbonates, polypropylenes, polyethylene, polyethylene terephthalates, polyphenylene oxides, polyacrylate esters, polymethacrylate esters, polyvinyl chlorides, polyvinylidenes, acrylonitrile polymers, methacrylonitrile polymers, polyvinyl acetates, celluloids, celluose acetates, polyvinyl pyrrolidones, cellulosic polymers, phenol formaldehydes, phenol-furfural resins, soluble polymers of polyimide, epoxy resins, polymerisable resins, natural rubbers, synthetic rubbers, silicone resins, methanol or bone glues, polystyrols, gum-lacs, copolymers of vinylidene and trifluoroethlene.

3. The triboelectric device according to claim 1, wherein said means for applying a polarizing voltage to a first material comprises means for adjusting a value of the polarizing voltage.

4. The triboelectric device according to claim 3, wherein the polarizing voltage is continuous.

5. The triboelectric device according to claim 3, wherein the polarizing voltage is alternating.

6. The triboelectric device according to claim 1, wherein the first material comprises particles which are selected from piezoelectric, slightly piezoelectric or non-piezoelectric particles.

7. The triboelectric device according to claim 6, wherein a size of the particles is between $5\times10^{-9}$ m and $5\times10^{-3}$ m.

8. The triboelectric device according to claim 6, wherein the particles have a same size.

9. The triboelectric device according to claim 6, wherein the particles are wholly or partly chosen from a biological material or piezoelectric plastic material, or from microcrystals.

10. The triboelectric device according to claim 9, wherein the biological material is chosen from oligosaccharides, homopolysaccharides, heteropolysaccharides, glycosaminoglycans, proteoglycans, terpenes, steriods, amino acids, oligopeptides and polypeptides, proteins, nucleotides or nucleic acids, urea or natural silk.

11. The triboelectric device according to claim 9, wherein the particles are, wholly or partly, microcrystals or fibres of ammonium tartrate, potassium tartrate, ethylene diamine tartrate, dipotassium tartrate, sodium chlorate, sodium bromate, nickel sulfate hexahydrate, iodic acid, benzophenone, hydrated or dehydrated lithium gallate, polyvinyl difluoridine, polyvinyl chloride, copolymer of vinyl acetate and vinylidene cyanide, copolymer of vinylidene and trifluoroethylene, polyvinyl flouride, nylon, polyacrylonitrile, polyparaxylene, polybichloromethyloextane, aromatic polymide, polysulfone, cyanoethlyicellulose, monosaccharides, disaccharides, brushite, monetite or salts of carboxylix acid.

12. The triboelectric device according to claim 9, wherein the particles are prepolarized in a through-thickness direction.

13. A triboelectric device comprising means for applying a polarizing voltage to a first material which is a polymer or dielectric organic substance, said means comprising a voltage source, a polarizing amplifier and electrodes which are not fixed to the first material, allowing relative rubbing displacement between the electrodes and the first material, wherein petrolatum is interposed between the electrodes and the first material.

14. The triboelectic device according the claim 13, wherein the polymer or the dielectric organic substance is chosen from the following group including polystyrenes, polysulfones, polycarbonates, polypropylenes, polyethylene, polyethylene terephthalates, polyphenylene oxides, polyacrylate esters, polymethacrylate esters, polyvinyl chlorides, polyvinylidenes, acrylonitrile polymers, methacrylonitrile polymers, polyvinyl acetates, celluloids, cellulose acetates, polyvinyl pyrrolidones, cellulosic polymers, phenol formaldehydes, phenol-furfural resins, soluble polymers of polyimide, epoxy resins, polymersible-resins, natural rubbers, synthetic rubbers, silicone resins, methanol or bone glues, polystyrols, gum-lacs, copolymers of vinylidene and trifluoroethlene.

15. The triboelectric device according to claim 13, wherein said means for applying a polarizing voltage to a first material comprises means for adjusting a value of the polarizing voltage.

16. The triboelectric device according to claim 13, wherein the first material comprises particles which are selected from piezoelectric, slightly piezoelectric or non-piezoelectric particles.

17. The triboelectric device according to claim 16, wherein a size of the particles is between $5 \times 10^{-9}$ m and $5 \times 10^{-3}$ m.

18. The triboelectric device according to claim 16, wherein the particles have a same size.

19. The triboelectric device according to claim 16, wherein the particles are wholly or partly chosen from a biological material or piezoelectric plastic material, or from microcrystals.

20. The triboelectric device according to claim 19, wherein the biological material is chosen from oligosaccharides, homopolysaccharides, heteropolysaccharides, glycosaminoglycans, proteoglycans, terpenes, steroids, amino acids, oligopeptides and polypeptides, proteins, nucleotides or nucleic acids, urea or natural silk.

21. The triboelectric device according to claim 19, wherein the particles are, wholly or partly, microcrystals or fibres of ammonium tartrate, potassium tartrate, ethylene diamine tartrate, dipotassium tartrate, sodium chlorate, sodium bromate, nickel sulfate hexahydrate, iodic acid, benzophenone, hydrated or dehydrated lithium gallate, polyvinyl difluoridine, polyvinyl chloride, copolymer of vinyl acetate and vinylidene cyanide, copolymer of vinylidene and trifluoroethylene, polyvinyl flouride, nylon, polyacrylonitrile, polyparaxylene, polybichloromethyloextane, aromatic polymide, polysulfone, cyanoethlyicellulose, monosaccharides, disaccharides, brushite, monetite or salts of carboxylix acid.

22. The triboelectric device according to claim 19, wherein the particles are prepolarized in a through-thickness direction.

* * * * *